(12) United States Patent
Miyamoto et al.

(10) Patent No.: US 12,120,915 B2
(45) Date of Patent: Oct. 15, 2024

(54) DISPLAY DEVICE WITH DRIVING TRANSISTOR HAVING UPPER AND LOWER GATE ELECTRODES

(71) Applicant: SHARP KABUSHIKI KAISHA, Sakai (JP)

(72) Inventors: Tadayoshi Miyamoto, Sakai (JP); Yoshinobu Nakamura, Sakai (JP); Kayo Haruguchi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 637 days.

(21) Appl. No.: 17/275,508

(22) PCT Filed: Sep. 18, 2018

(86) PCT No.: PCT/JP2018/034510
§ 371 (c)(1),
(2) Date: Mar. 11, 2021

(87) PCT Pub. No.: WO2020/059027
PCT Pub. Date: Mar. 26, 2020

(65) Prior Publication Data
US 2022/0115479 A1 Apr. 14, 2022

(51) Int. Cl.
*H10K 59/121* (2023.01)
*H01L 27/12* (2006.01)
*H01L 29/786* (2006.01)

(52) U.S. Cl.
CPC ..... *H10K 59/1213* (2023.02); *H10K 59/1216* (2023.02); *H01L 27/1225* (2013.01);
(Continued)

(58) Field of Classification Search
CPC ............ H10K 59/1213; H10K 59/1216; H01L 27/1225; H01L 27/1255; H01L 29/78648; H01L 29/7869
See application file for complete search history.

(56) References Cited

U.S. PATENT DOCUMENTS

2004/0089878 A1* 5/2004 Takehashi ......... H01L 29/78621
257/E21.414
2007/0052647 A1* 3/2007 Chen .................... G09G 3/3233
345/92
(Continued)

FOREIGN PATENT DOCUMENTS

| JP | 2013-110291 A | 6/2013 |
| JP | 2015195363 A | 11/2015 |

(Continued)

*Primary Examiner* — Lex H Malsawma
(74) *Attorney, Agent, or Firm* — ScienBiziP, P.C.

(57) ABSTRACT

A display device includes a drive transistor and a switching transistor formed by layering an inorganic insulating film, an oxide semiconductor layer, an upper gate insulating layer, an upper gate electrode, and an interlayer insulating film. The drive transistor and the switching transistor include an oxide semiconductor film formed of the oxide semiconductor layer and provided in an island shape corresponding to the drive transistor and an island shape corresponding to the switching transistor, and the oxide semiconductor film includes a channel region overlapping with the upper gate electrode corresponding to the oxide semiconductor film, and a source region and a drain region. The drive transistor is provided with a lower gate electrode and a lower gate insulating layer between the inorganic insulating film and the oxide semiconductor layer. The length of lower gate electrode is less than or equal to the length of upper gate electrode.

15 Claims, 9 Drawing Sheets

(52) U.S. Cl.
CPC .... *H01L 27/1255* (2013.01); *H01L 29/78648* (2013.01); *H01L 29/7869* (2013.01)

(56) References Cited

U.S. PATENT DOCUMENTS

| | | | |
|---|---|---|---|
| 2009/0020761 A1* | 1/2009 | Okazaki | H01L 27/1266 257/66 |
| 2010/0079169 A1* | 4/2010 | Kim | H01L 27/1203 326/120 |
| 2012/0256184 A1* | 10/2012 | Kaneko | H01L 29/78645 257/E29.273 |
| 2015/0263312 A1 | 9/2015 | Kanegae | |
| 2016/0329392 A1* | 11/2016 | Miyake | G09G 3/3233 |
| 2017/0005152 A1* | 1/2017 | Hong | H01L 29/78603 |
| 2017/0352313 A1 | 12/2017 | Miyake | |
| 2018/0166585 A1* | 6/2018 | Takechi | G09G 3/3266 |
| 2018/0175077 A1* | 6/2018 | Koo | H10K 59/126 |
| 2019/0123300 A1 | 4/2019 | Kanegae | |

FOREIGN PATENT DOCUMENTS

| | | |
|---|---|---|
| JP | 2017219839 A | 12/2017 |
| JP | 2018098364 A | 6/2018 |

\* cited by examiner

DISPLAY DEVICE WITH DRIVING TRANSISTOR HAVING UPPER AND LOWER GATE ELECTRODES

DISPLAY DEVICE WITH DRIVING TRANSISTOR HAVING UPPER AND LOWER GATE ELECTRODES

TECHNICAL FIELD

The disclosure relates to a display device including two transistors.

BACKGROUND ART

In recent years, with advances in Organic Light Emitting Diode (OLED) technology, products equipped with organic electroluminescence (EL) display devices have become widespread. In general, in an organic EL display device, a configuration including a pixel circuit that supplies a current to the pixels in a light-emitting layer is used, and a thin film transistor (TFT) is provided in the pixel circuit. Examples of the TFT used in such a pixel circuit include a top gate structure (see, for example, PTL 1).

CITATION LIST

Patent Literature

PTL 1: JP 2015-195363 A

SUMMARY

Technical Problem

The organic EL display device disclosed in PTL 1 includes a thin film transistor element substrate formed by layering an oxide semiconductor layer, a gate insulating layer, and a gate electrode having a channel region on a substrate.

In the pixel circuit, luminance is controlled by using a transistor or the like, and there is a demand for mixing transistors having various characteristics. In particular, for a TFT, a double gate structure is proposed that can increase the S value as an element for enhancing luminance control. However, in a double gate structure TFT, an increase in parasitic capacitance occurring between the gate electrode and the conductor region is concerned.

In order to solve the above problem, an object of the disclosure is to provide a display device that can increase reliability of a pixel circuit while combining transistors having different characteristics in the pixel circuit.

Solution to Problem

A display device according to the disclosure is a display device including, on a substrate, a pixel circuit including a drive transistor and a switching transistor formed by layering an inorganic insulating film, an oxide semiconductor layer, an upper gate insulating layer, an upper gate electrode, and an interlayer insulating film, wherein the drive transistor and the switching transistor include an oxide semiconductor film formed of the oxide semiconductor layer and provided in an island shape corresponding to the drive transistor and an island shape corresponding to the switching transistor, the oxide semiconductor film includes a channel region overlapping with the upper gate electrode corresponding to the oxide semiconductor film, and a source region and a drain region provided sandwiching the channel region the channel region between the source region and the drain region, in the drive transistor and the switching transistor, the upper gate electrode, the upper gate insulating layer, and the channel region corresponding to each of the drive transistor and the switching transistor are aligned in a plan view, the drive transistor is provided with a lower gate electrode and a lower gate insulating layer between the inorganic insulating film and the oxide semiconductor layer, and in a channel length direction in which the source region and the drain region are opposed to each other, a length of the lower gate electrode of the drive transistor is less than or equal to a length of the upper gate electrode of the drive transistor.

The display device according to the disclosure may be configured such that in the drive transistor, a gate signal is applied to the lower gate electrode and a fixed voltage is applied to the upper gate electrode.

The display device according to the disclosure may be configured such that the fixed voltage is a ground potential.

The display device according to the disclosure may be configured such that in the switching transistor, a gate signal is applied to the upper gate electrode.

The display device according to the disclosure may be configured such that in the drive transistor, a film thickness of the lower gate insulating layer between the lower gate electrode and the oxide semiconductor film is greater than a film thickness of the upper gate insulating layer.

The display device according to the disclosure may be configured such that the display device includes a terminal electrode layered on the interlayer insulating film, wherein the terminal electrode is electrically connected to the source region and the drain region corresponding to the terminal electrode via a contact hole formed in the interlayer insulating film.

The display device according to the disclosure may be configured such that the pixel circuit includes the switching transistor to serve as a writing control transistor.

The display device according to the disclosure may be configured such that in the writing control transistor, a gate signal is applied to the upper gate electrode.

The display device according to the disclosure may be configured such that the writing control transistor is not provided with the lower gate electrode.

The display device according to the disclosure may be configured such that the pixel circuit includes a capacitor including a first electrode and a second electrode, and the capacitor includes the first electrode electrically connected to the lower gate electrode of the drive transistor and the second electrode electrically connected to the source region of the drive transistor.

The display device according to the disclosure may be configured such that the display device includes a plurality of light-emitting elements formed on the interlayer insulating film, wherein each of the plurality of light-emitting elements is formed by layering an anode electrode, a light-emitting layer, and a cathode electrode in this order on the interlayer insulating film, and the cathode electrode is configured to be shared by the plurality of light-emitting elements.

The display device according to the disclosure may be configured such that the pixel circuit includes the switching transistor to serve as a light emission control transistor, and the drive transistor is provided between each of the plurality of light-emitting elements and the light emission control transistor.

The display device according to the disclosure may be configured such that the display device includes a plurality of light-emitting elements formed on the interlayer insulating film, wherein each of the plurality of light-emitting elements is formed by layering an anode electrode, a light-emitting layer, and a cathode electrode in this order on the interlayer insulating film, and the anode electrode is configured to be shared by the plurality of light-emitting elements.

The display device according to the disclosure may be configured such that the pixel circuit includes the switching transistor to serve as a light emission control transistor, and the light emission control transistor is provided between the drive transistor and a high power supply voltage wiring line.

The display device according to the disclosure may be configured such that the oxide semiconductor film is formed of a material including an In—Ga—Zn—O based semiconductor.

The display device according to the disclosure may be configured such that the In—Ga—Zn—O based semiconductor includes a crystalline portion.

Advantageous Effects of Disclosure

According to the disclosure, it is possible to obtain a pixel circuit having both a drive transistor and a switching transistor having different characteristics. In other words, since a drive transistor has a double gate structure having a lower gate electrode and an upper gate electrode, more detailed control can be performed. At this time, since the lower gate electrode is shorter than the upper gate electrode, occurrence of parasitic capacitance between the source region and the drain region, and the lower gate electrode can be suppressed, and the reliability of the pixel circuit can be increased.

DESCRIPTION OF EMBODIMENTS

First Embodiment

Hereinafter, a display device according to a first embodiment of the disclosure will be described with reference to drawings.

Figure 1:
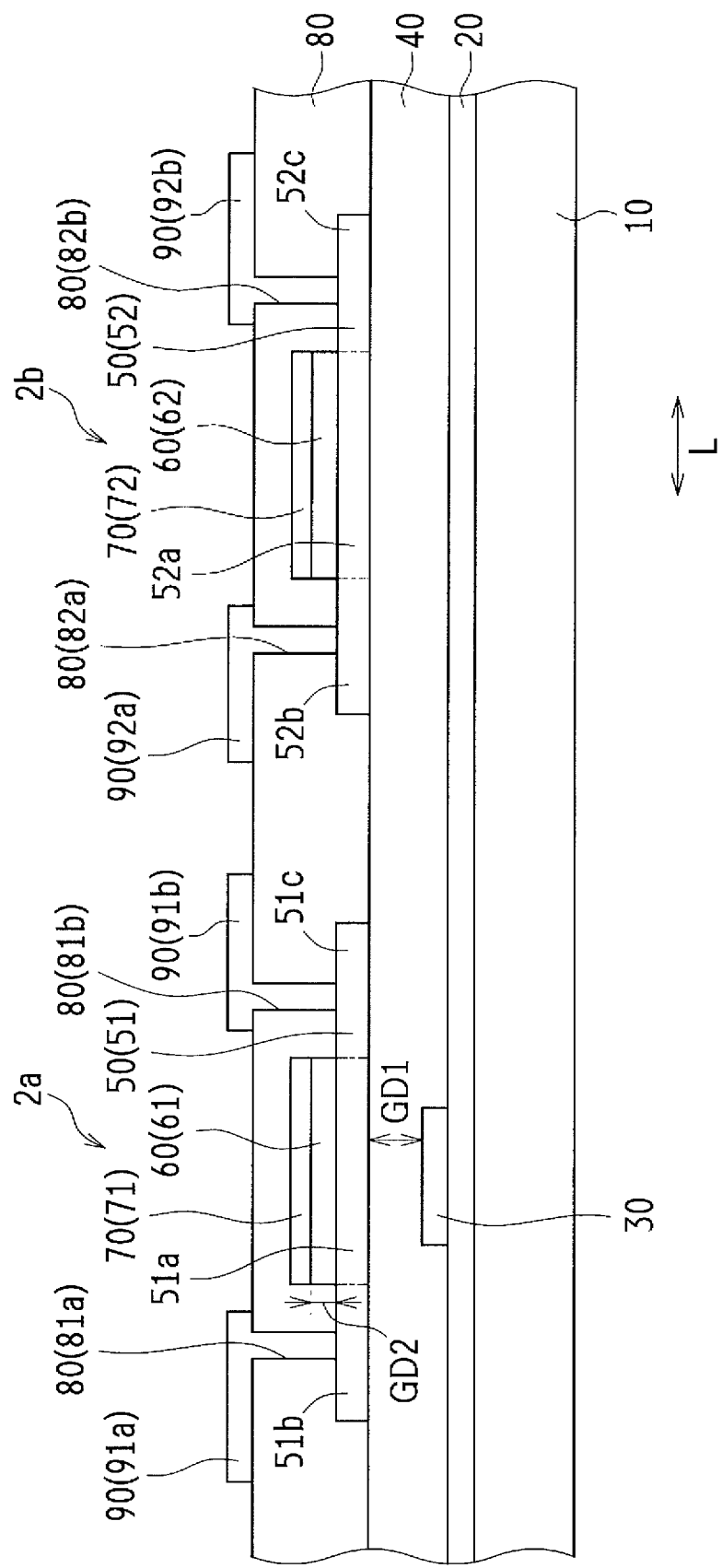
FIG. 1 is a schematic cross-sectional view schematically illustrating a drive transistor and a switching transistor in a display device according to a first embodiment of the disclosure.
Figure 2A:
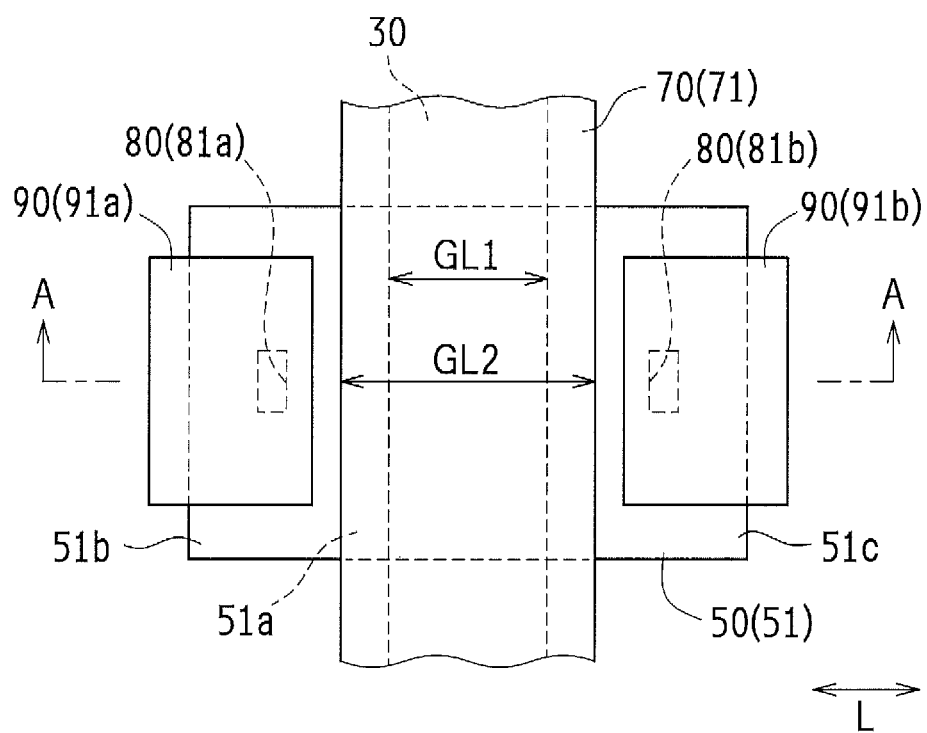
FIG. 2A is a schematic plan view of the drive transistor illustrated in FIG. 1.
Figure 2B:
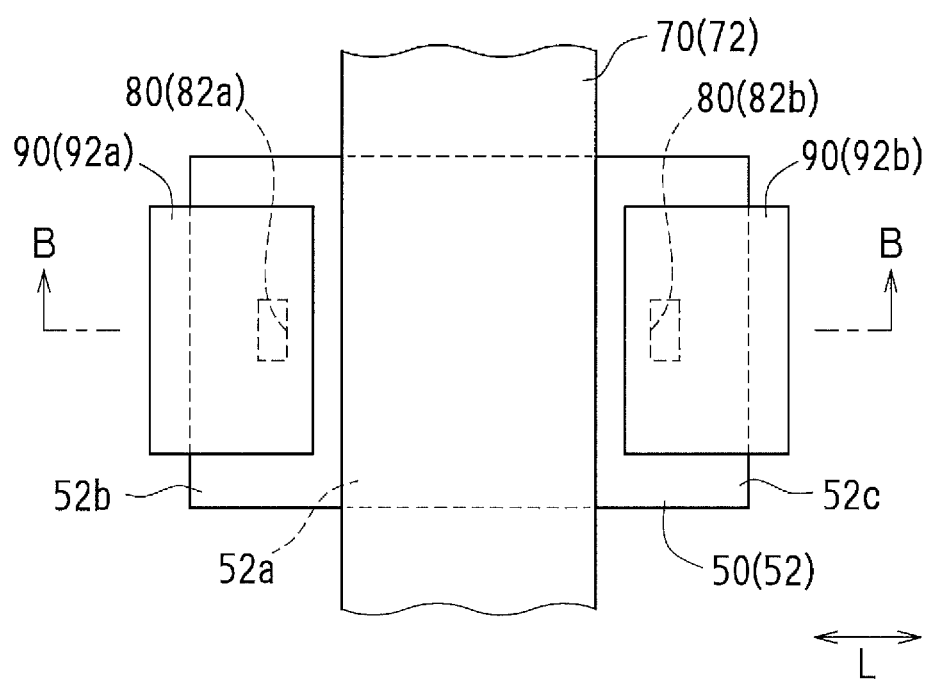
FIG. 2B is a schematic plan view of the switching transistor illustrated in FIG. 1.

FIG. 1 is a schematic cross-sectional view schematically illustrating a drive transistor and a switching transistor in the display device according to the first embodiment of the disclosure. FIG. 2A is a schematic plan view of the drive transistor illustrated in FIG. 1. FIG. 2B is a schematic plan view of the switching transistor illustrated in FIG. 1. Note that, in view of the visibility of the drawings, hatching is omitted in FIG. 1, and in FIG. 2A and FIG. 2B, an interlayer insulating film 80 and the like are shown transparently.

The display device 1 according to the first embodiment of the disclosure includes a drive transistor 2a and a switching transistor 2b formed on the same substrate 10. The drive transistor 2a and the switching transistor 2b are configured by sequentially layering, on the substrate 10, an inorganic insulating film 20, a lower gate electrode 30, a lower gate insulating layer 40, an oxide semiconductor layer 50, an upper gate insulating layer 60, an upper gate electrode 70, an interlayer insulating film 80, and a terminal electrode 90. Note that the manufacturing process of the drive transistor 2a and the switching transistor 2b and the details of each portion will be described with reference to FIG. 3 to FIG. 6 described below.

In FIG. 1, two transistors (the drive transistor 2a and the switching transistor 2b) formed on the substrate 10 are enlarged, and a plurality of transistors may be further formed on the substrate 10. In FIG. 1, the drive transistor 2a and the switching transistor 2b are schematically arranged, and the positional relationship between the two may be appropriately adjusted, and the orientation and the like may be changed. The drive transistor 2a illustrated in FIG. 1 corresponds to a cross section taken along the arrow mark A-A in FIG. 2A, and the switching transistor 2b illustrated in FIG. 1 corresponds to a cross section taken along the arrow mark B-B in FIG. 2B.

The inorganic insulating film 20 is formed so as to cover the entire surface of the substrate 10. Note that, for the purpose of explanation below, the left-right direction in FIG. 1, which is the direction along the surface of the substrate 10, may be referred to as the channel length direction L.

The lower gate electrode 30 is provided on the inorganic insulating film 20 at a portion corresponding to the drive transistor 2a. Specifically, the lower gate electrode 30 is provided on a portion corresponding to the drive transistor 2a substantially in the center in the channel length direction L. The lower gate electrode 30 is not provided on a portion corresponding to the switching transistor 2b.

The lower gate insulating layer 40 is provided on the lower gate electrode 30 and covers the portion of the inorganic insulating film 20 not overlapping with the lower gate electrode 30. In other words, the lower gate insulating layer 40 is formed so as to cover the entire surface of the substrate 10. In the portion corresponding to the switching transistor 2b, the entire surface of the inorganic insulating film 20 is covered by the lower gate insulating layer 40.

The oxide semiconductor layer 50 (a drive side oxide semiconductor film 51 and a switching side oxide semiconductor film 52) is provided on the lower gate insulating layer 40, and is disposed in an island shape for each of the transistors. In other words, the drive side oxide semiconductor film 51 corresponding to the drive transistor 2a is provided separated from the switching side oxide semiconductor film 52 corresponding to the switching transistor 2b.

The drive side oxide semiconductor film 51 includes a drive side channel region 51a located at the center in the channel length direction L, a drive side source region 51b (left side in FIG. 1) and a drive side drain region 51c (right side in FIG. 1) provided so as to sandwich the drive side channel region 51a therebetween. In other words, the drive side source region 51b and the drive side drain region 51c are opposed to each other in the channel length direction L. In the switching side oxide semiconductor film 52, a switching side channel region 52a, a switching side source region 52b, and a switching side drain region 52c are provided in a similar manner to the drive side oxide semiconductor film 51. In FIG. 1, the boundaries between the drive side channel region 51a, the drive side source region 51b, and the drive side drain region 51c, and the boundaries between the switching side channel region 52a, the switching side source region 52b, and the switching side drain region 52c are indicated by dot-dash lines.

The upper gate insulating layer 60 is provided on the drive side oxide semiconductor film 51 at a portion overlapping with the drive side channel region 51a (drive side upper gate insulating layer 61) and on the switching side oxide semiconductor film 52 at a portion overlapping with the switching side channel region 52a (switching side upper gate insulating layer 62). The upper gate electrode 70 is disposed on the upper gate insulating layer 60 so as to overlap with the upper gate insulating layer 60. That is, the upper gate electrode 70 is provided in both the portion corresponding to the drive transistor 2a (drive side upper gate electrode 71) and the portion corresponding to the switching transistor 2b (switching side upper gate electrode 72).

As illustrated in FIG. 1 to FIG. 2B, in the drive transistor 2a, the drive side upper gate electrode 71, the drive side upper gate insulating layer 61, and the drive side channel region 51a are aligned in a plan view, and in the switching transistor 2b, the switching side upper gate electrode 72, the switching side upper gate insulating layer 62, and the switching side channel region 52a are aligned in a plan view. Note that the alignment here does not imply exactly matching, but also includes a shift in dimensions of approximately several micrometers caused by differences in etching rate or the like.

The interlayer insulating film 80 is formed so as to cover the lower gate insulating layer 40, the oxide semiconductor layer 50, and the upper gate electrode 70. The terminal electrode 90 is provided on the interlayer insulating film 80 at two locations apart from each other in the channel length direction L for each transistor.

In the drive transistor 2a, one of the terminal electrodes 90 corresponds to the source electrode (drive side source electrode 91a), and is electrically connected to the drive side source region 51b via a contact hole (drive side source contact hole 81a) provided in the interlayer insulating film 80. The other one of the terminal electrodes 90 corresponds to the drain electrode (drive side drain electrode 91b), and is electrically connected to the drive side drain region 51c via a contact hole (drive side drain contact hole 81b) provided in the interlayer insulating film 80.

Similarly to the drive transistor 2a, in the terminal electrode 90 in the switching transistor 2b, the switching side source electrode 92a is electrically connected to the switching side source region 52b via the switching side source contact hole 82a, and the switching side drain electrode 92b is electrically connected to the switching side drain region 52c via the switching side drain contact hole 82b.

As illustrated in FIG. 1, in the drive transistor 2a, the thickness (first drive gate film thickness GD1) of the lower gate insulating layer 40 at the portion where the lower gate electrode 30 and the drive side channel region 51a overlap is greater than the thickness of the drive side upper gate insulating layer 61 (second drive gate film thickness GD2).

As described below, the lower gate insulating layer 40 is easier to thicken than the upper gate insulating layer 60 that is etched to align with the upper gate electrode 70. By making the upper gate insulating layer 60 thinner than the lower gate insulating layer 40, ON-current Ion is more likely to increase, and reliability degradation can be improved.

As illustrated in FIG. 2A, in the drive transistor 2a, the length in the channel length direction L of the lower gate electrode 30 (first drive gate length GL1) is not greater than the length in the channel length direction L of the upper gate electrode 70 (second drive gate length GL2). Specifically, the first drive gate length GL1 is set to 5 µm, and the second drive gate length GL2 is set to 7.5 µm. The lower gate electrode 30 is disposed so that the distance (offset) between the drive side source region 51b and the own end portion and the distance between the drive side drain region 51c and the own end portion are substantially the same. The value of the offset may be set as appropriate to be 0.5 to 1.5 µm.

In a plan view, the lower gate electrode 30 and the upper gate electrode 70 are extended to the outside of the corresponding transistor, and are, for example, gate wiring lines that are connected to other transistors and the like. Although FIG. 2A and FIG. 2B illustrate a configuration in which the lower gate electrode 30 and the upper gate electrode 70 extend in a straight line, but the configuration is not limited thereto, and depending on the position of the object to be connected, the extension orientation may be changed as appropriate. The terminal electrode 90 may extend to the outside of the corresponding transistor, and may be, for example, a wiring line that is connected to another transistor or the like.

Next, the manufacturing process of the drive transistor 2a and the switching transistor 2b will be described in detail with reference to FIG. 3 to FIG. 6.

Figure 3:
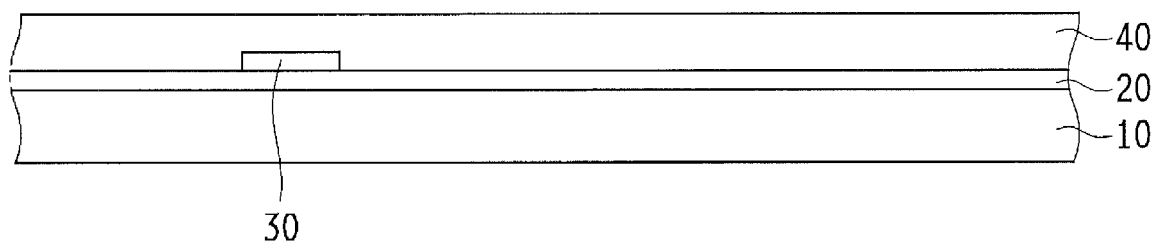
FIG. 3 is a schematic cross-sectional view illustrating a substrate that has undergone a lower gate formation step.

FIG. 3 is a schematic cross-sectional view illustrating a substrate that has undergone a lower gate formation step.

In the manufacturing process of the drive transistor 2a and the switching transistor 2b, first, an inorganic insulating film 20, which is an insulating film, is film formed on the substrate 10. For example, a glass substrate, a silicon substrate, and a plastic substrate (resin substrate) having heat resistance can be used as the substrate 10. As a material of the plastic substrate (resin substrate), polyethylene terephthalate (PET), polyethylene naphthalate (PEN), polyethersulfone (PES), acrylic resin, polyimide, or the like, can be used. The inorganic insulating film 20 is formed of, for example, silicon oxide ($SiO_2$), silicon nitride ($SiN_x$), silicon oxynitride ($SiO_xN_y$; x>y), silicon nitride oxide ($SiN_xO_y$; x>y), or the like. In the present embodiment, the inorganic insulating film 20 formed of silicon nitride having a thickness of 250 nm is film formed by a plasma CVD method. However, the inorganic insulating film 20 may be formed of a single compound, or a plurality of layers may be layered.

Next, in the lower gate formation step, the lower gate electrode 30 and the lower gate insulating layer 40 are formed on the inorganic insulating film 20. Specifically, the metal film that serves as the base of the lower gate electrode 30 is film formed by using a sputtering method, and the lower gate electrode 30 is formed at a portion corresponding to the drive transistor 2a by patterning the metal film in a photolithography process. The metal film that serves as the base of the lower gate electrode 30 may be, for example, a metal film containing an element selected from aluminum (Al), tungsten (W), molybdenum (Mo), tantalum (Ta), chromium (Cr), titanium (Ti), and copper (Cu), or an alloy film or the like containing these elements as components thereof, or a layered film containing a plurality of these films may be used. In the present embodiment, a layered film (MoN/Al film) including a MoN layer having a thickness of 50 nm as an upper layer and an Al layer having a thickness of 350 nm as a lower layer is formed.

The lower gate insulating layer 40 is formed from a material similar to that of the inorganic insulating film 20. In the present embodiment, silicon oxide having a thickness of 375 nm is formed by a CVD method.

Figure 4:
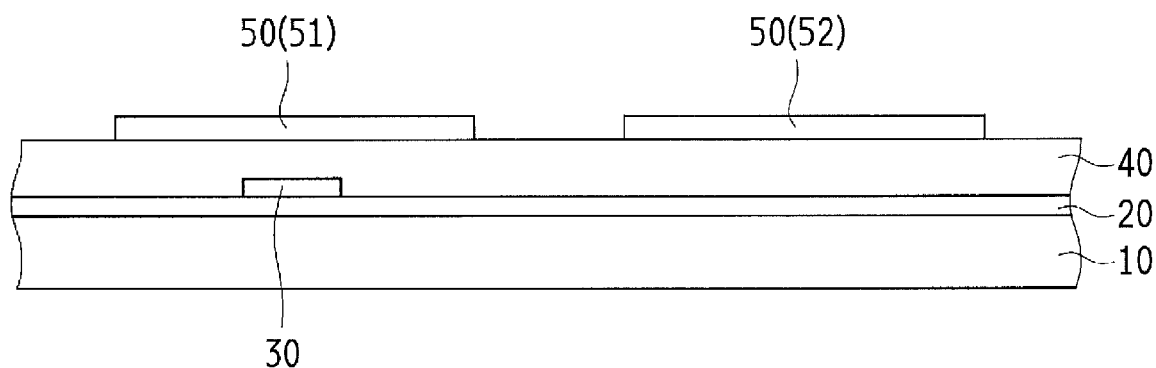
FIG. 4 is a schematic cross-sectional view illustrating the substrate that has undergone an oxide semiconductor film formation step.

FIG. 4 is a schematic cross-sectional view illustrating the substrate that has undergone an oxide semiconductor film formation step.

Next, an oxide semiconductor that serves as the base of the oxide semiconductor layer 50 is film formed on the lower gate insulating layer 40. The oxide semiconductor film mentioned above is, for example, an In—Ga—Zn—O based semiconductor film having a thickness of 30 nm or more and 100 nm or less that is formed by a sputtering method. The oxide semiconductor is formed in an island shape corresponding to the drive transistor and the switching transistor 2b by patterning by a photolithography process and etching. In other words, when the oxide semiconductor is film formed, the oxide semiconductor covers the entire surface so as to include the drive side oxide semiconductor film 51 and the switching side oxide semiconductor film 52, but is separated into the drive side oxide semiconductor film 51 and the switching side oxide semiconductor film 52 by patterning.

Figure 5:
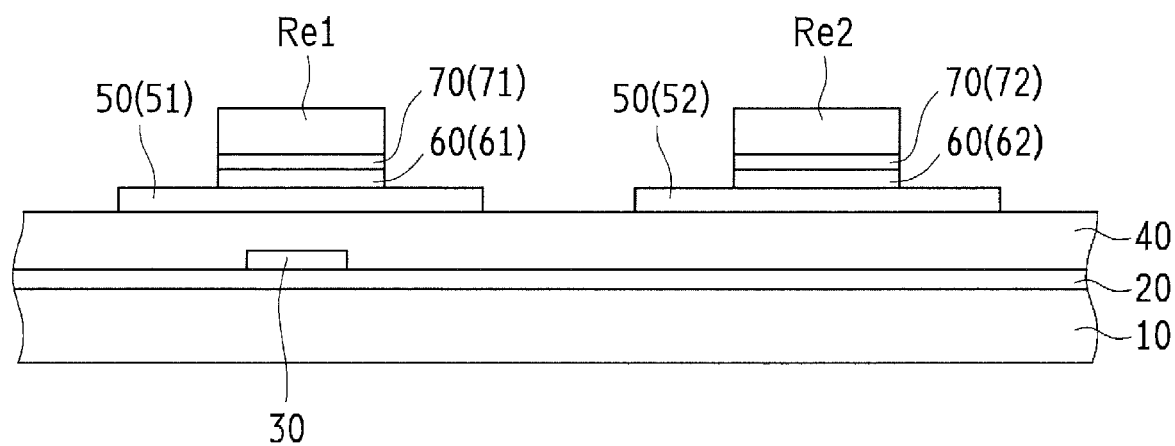
FIG. 5 is a schematic cross-sectional view illustrating the substrate that has undergone an upper gate formation step.

FIG. 5 is a schematic cross-sectional view illustrating the substrate that has undergone an upper gate formation step.

In the upper gate formation step, an insulating film that serves as the base of the upper gate insulating layer 60 and a metal film that serves as the base of the upper gate electrode 70 are first layered so as to cover the drive side oxide semiconductor film 51 and the switching side oxide semiconductor film 52. The upper gate insulating layer 60 is formed of a material similar to the lower gate insulating layer 40, and the upper gate electrode 70 is formed of a material similar to the lower gate electrode 30. In the present embodiment, silicon oxide having a thickness of 150 nm is formed by a CVD method, and a layered film (MoN/Al film) including a MoN layer having a thickness of 50 nm as an upper layer and an Al layer having a thickness of 350 nm as a lower layer is formed.

Thereafter, a first resist mask Re1 and a second resist mask Re2 are formed on the metal film that serves as the base of the upper gate electrode 70 by a photolithography process. The first resist mask Re1 is provided in a portion overlapping with the drive side channel region 51a illustrated in FIG. 1, and the second resist mask Re2 is provided in a portion overlapping the switching side channel region 52a illustrated in FIG. 1. Then, by etching the metal film and the gate insulating film by using a known method, the drive side upper gate electrode 71 and the drive side upper gate insulating layer 61 having a shape corresponding to the first resist mask Re1, and the switching side upper gate electrode 72 and the switching side upper gate insulating layer 62 having a shape corresponding to the second resist mask Re2 are formed. In this manner, by using a self-alignment structure in which the upper gate electrode 70 and the upper gate insulating layer 60 are aligned, it is possible to accurately align the two while simplifying the process.

Figure 6:
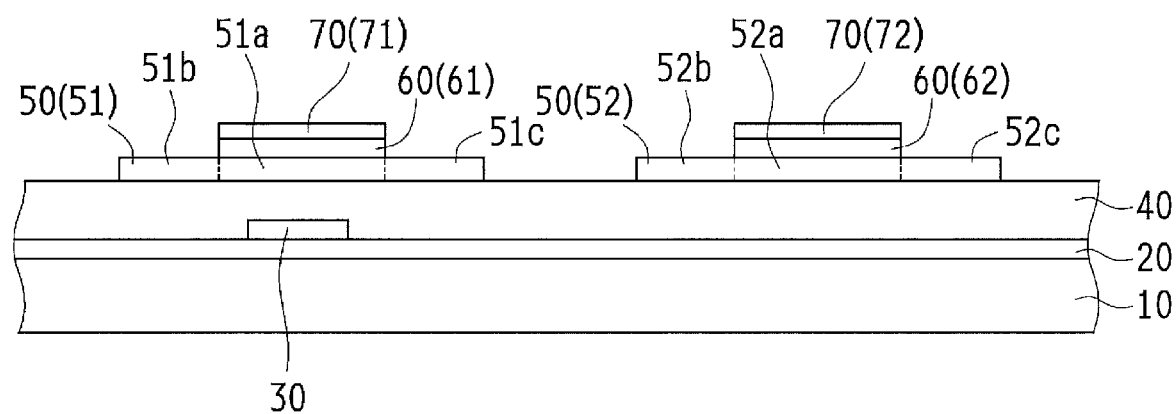
FIG. 6 is a schematic cross-sectional view illustrating the substrate that has undergone a conductor step.

FIG. 6 is a schematic cross-sectional view illustrating the substrate that has undergone a conductor step.

After removing the resist mask formed in the upper gate formation step, plasma processing is performed as a conductor step. Examples of plasma processing include, for example, hydrogen plasma processing, He plasma processing, and the like. During plasma processing, the upper gate electrode 70 functions as a mask, and the portion not covered by the upper gate electrode 70 is reduced in resistance. As a result, in the drive transistor 2a, the drive side source region 51b and the drive side drain region 51c are reduced in resistance, and in the switching transistor 2b, the drive side source region 51b and the drive side drain region 51c are reduced in resistance.

After the conductor processing is completed, the resist mask is removed, and an interlayer insulating film 80 covering the lower gate insulating layer 40, the oxide semiconductor layer 50, and the upper gate electrode 70 is film formed. In the present embodiment, a silicon nitride layer having a thickness of 100 nm and a silicon oxide layer having a thickness of 300 nm are continuously layered as the interlayer insulating film 80.

A contact hole (see FIG. 1) exposing a portion of the oxide semiconductor layer 50 is formed in the interlayer insulating film 80 by a known photolithography process and etching.

After the interlayer insulating film 80 is formed, an electrode conductive film that serves as the base of the terminal electrode 90 is film formed on the interlayer insulating film 80 and within the contact hole. For the electrode conductive film, a material exemplified as the lower gate electrode 30 may be used. In the present embodiment, a layered film (Ti/Al/Ti film) including a Ti layer having a thickness of 50 nm as an upper layer, an Al layer having a thickness of 350 nm as a middle layer, and an Ti layer having a thickness of 50 nm as a lower layer is formed. The electrode conductive film is patterned to form the terminal electrode 90 (see FIG. 1) corresponding to each transistor.

With regard to the interlayer insulating film 80 illustrated in FIG. 1, the upper face is illustrated flat in consideration of the visibility of the drawing. However, no such limitation is intended, and the interlayer insulating film 80 may have a uniform thickness, and the concavities and convexities in the lower layer may be reflected on the upper face.

Note that, although not illustrated in the drawings, a protection layer may be provided so as to cover the upper face of the transistor (the side on which the terminal electrode 90 is formed), an anode electrode (anode electrode), a light-emitting layer, a cathode electrode (cathode electrode), a sealing film, or the like may be provided on the protection layer, and these may be connected with transistors as appropriate to form an organic EL display device. A light-emitting element D1, which will be described later, is constituted by an anode electrode, a light-emitting layer, and a cathode electrode sequentially layered on the protection layer. A plurality of light-emitting elements D1 may be provided, for example, by separating the light-emitting layer. At this time, either the anode electrode or the cathode electrode may not be electrically separated, and in the plurality of light-emitting elements D1, either the anode electrode or the cathode electrode may be configured to be common.

A metal layer and an inorganic insulating layer may be further layered between the interlayer insulating film 80 and the terminal electrode 90. The layer provided between the interlayer insulating film 80 and the terminal electrode 90 may be formed in part by patterning or the like as appropriate. For example, the layer may be formed so as to avoid contact holes not to prevent the connection by the contact holes. The protection layer covering the upper face of the transistor may be a flattening film (resin layer).

The oxide semiconductor layer 50 is not limited to the material described above, but may be formed from other materials. An oxide semiconductor included in the oxide semiconductor layer 50 may be, for example, an amorphous oxide semiconductor, or may be a crystalline oxide semiconductor including a crystalline portion. Examples of the crystalline oxide semiconductor include a polycrystalline oxide semiconductor, a microcrystalline oxide semiconductor, or a crystalline oxide semiconductor having a c-axis oriented substantially perpendicular to the layer surface.

The oxide semiconductor layer 50 may have a layered structure having two or more layers, and in this case, the oxide semiconductor layer 50 may include an amorphous oxide semiconductor layer and a crystalline oxide semiconductor layer. Alternatively, the oxide semiconductor layer 50 may include a plurality of crystalline oxide semiconductor layers having different crystal structures, or a plurality of amorphous oxide semiconductor layers.

Next, the material, structure, and the like of the amorphous oxide semiconductor and the crystalline oxide semiconductor will be described in detail. The oxide semiconductor layer 50 may contain, for example, at least one kind of metal element from In, Ga, and Zn, and in the present embodiment, an In—Ga—Zn—O based semiconductor (for example, indium gallium zinc oxide) is used. Here, the In—Ga—Zn—O based semiconductor is a ternary oxide of In (indium), Ga (gallium), and Zn (zinc), and a ratio (composition ratio) of In, Ga, and Zn is not particularly limited. For example, the ratio includes In:Ga:Zn=2:2:1, In:Ga:Zn=1:1:1, In:Ga:Zn=1:1:2, or the like. The In—Ga—Zn—O based semiconductor may be an amorphous semiconductor or may be a crystalline semiconductor. A crystalline In—Ga—Zn—O based semiconductor in which a c-axis is oriented substantially perpendicular to a layer surface is preferable as the crystalline In—Ga—Zn—O based semiconductor.

Since a TFT having an In—Ga—Zn—O based semiconductor layer has a high mobility and a low leakage current compared to a-SiTFT, the TFT can be suitably used as a transistor of the display device, In place of the In—Ga—Zn—O based semiconductor, the oxide semiconductor layer 50 may include another oxide semiconductor, for example, an In—Sn—Zn—O based semiconductor. The In—Sn—Zn—O based semiconductor is a ternary oxide of In, Sn (tin), and Zn, and examples thereof include $In_2O_3$—$SnO_2$—ZnO (InSnZnO).

The oxide semiconductor layer 50 is not limited to this, but may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, cadmium oxide (CdO), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, an Al—Ga—Zn—O based semiconductor, a Ga—Zn—O based semiconductor, an In—Ga—Zn—Sn—O based semiconductor, $InGaO_3(ZnO)_5$, magnesium zinc oxide ($Mg_XZn_{1-X}O$), cadmium zinc oxide ($Cd_XZn_{1-X}O$), or the like. As the Zn—O based semiconductor, a semiconductor in an amorphous state of ZnO to which an impurity element of one kind or a plurality of kinds among a first group element, a 13-th group element, a 14-th group element, a 15-th group element, or a 17-th group element is added, a polycrystalline state, or a microcrystalline state in which the amorphous state and the polycrystalline state are mixed, or a semiconductor to which no impurity element is added can be used.

With the above-described configuration, it is possible to obtain a pixel circuit having both the drive transistor 2a and the switching transistor 2b having different characteristics. In other words, since the drive transistor 2a has a double gate structure having the lower gate electrode 30 and the upper gate electrode 70, more detailed control can be performed. At this time, since the lower gate electrode 30 is shorter than the upper gate electrode 70, occurrence of parasitic capacitance between the source region, the drain region, and the lower gate electrode 30 can be suppressed, and the reliability of the pixel circuit can be increased.

Next, an example of a pixel circuit of the display device 1 (first circuit 3a) will be described with reference to the drawings.

Figure 7:
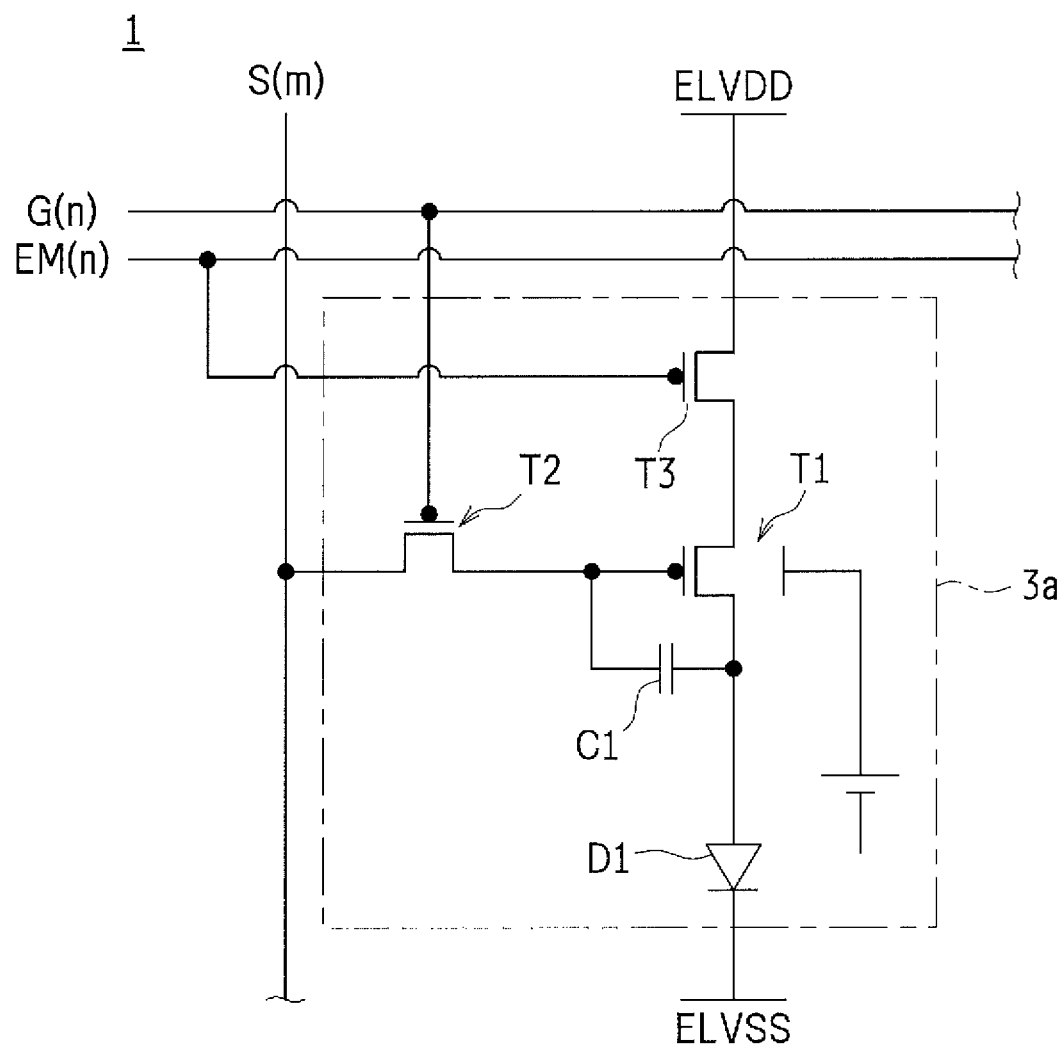
FIG. 7 is an equivalent circuit diagram illustrating a first circuit that is an example of a pixel circuit.

FIG. 7 is an equivalent circuit diagram illustrating a first circuit that is an example of a pixel circuit.

The display device 1 includes a display region constituted by a plurality of pixels arrayed in a matrix shape. The plurality of pixels typically include red subpixels that display red, green subpixels that display green, and blue subpixels that display blue. The display device 1 is provided with pixel circuits for each of the plurality of subpixels, and FIG. 7 illustrates the vicinity of the first circuit 3a, which is an example of the pixel circuit.

The straight line corresponding to "S (m)" in FIG. 7 indicates a source signal line, the straight line corresponding to "G (n)" indicates a gate signal line, and the straight line corresponding to "EM (n)" indicates a light emission control line. "ELVDD" in FIG. 7 indicates a high power supply voltage, and the straight lines connected to this correspond to high power supply voltage wiring lines. Furthermore, "ELVSS" in FIG. 7 indicates a low power supply voltage, and the straight lines connected to this correspond to low power supply voltage wiring lines.

The first circuit 3a includes three transistors (a first transistor T1, a second transistor T2, and a third transistor T3), a capacitor C1, and a light-emitting element D1.

The drive transistor 2a described above is applied to the first transistor T1. The first transistor T1 includes a source electrode connected to the anode electrode of the light-emitting element D1, a drain electrode connected to the drain electrode of the third transistor T3, and one gate electrode (lower gate electrode 30) connected to the drain electrode of the second transistor T2. The other gate electrode (upper gate electrode 70) of the first transistor T1 is connected to a fixed voltage source. Here, the potential of the fixed voltage source may be the ground potential.

The second transistor T2 is a writing transistor, and the switching transistor 2b described above is applied to the second transistor T2. The second transistor T2 includes a source electrode connected to the source signal line, a drain electrode connected to one gate electrode of the first transistor T1, and a gate electrode connected to the gate signal line.

The third transistor T3 is a light emission control transistor, and the switching transistor 2b described above is applied to the third transistor T3. The third transistor T3 includes a source electrode connected to the high power supply voltage wiring line, a drain electrode connected to the drain electrode of the first transistor T1, and a gate electrode connected to the light emission control line.

The light-emitting element D1 includes an anode electrode connected to the source electrode of the first transistor T1 and a cathode electrode connected to the low power supply voltage wiring line.

The capacitor C1 includes a first electrode connected to one gate electrode (lower gate electrode 30) of the first transistor T1 and a second electrode connected to the source electrode of the first transistor T1. Note that the second electrode of the capacitor C1 may be connected to the drain electrode side of the first transistor T1. In this case, the voltage drop when a current flows through the light-emitting element D1 occurs on the source electrode side of the first transistor T1, so the current may change and the drive current may change.

In the first transistor T1, a reliable operation as a transistor can be guaranteed by applying a gate signal to the lower gate electrode 30 whose parasitic capacitance is suppressed.

In the first circuit 3a, the drive transistor 2a (first transistor T1) is provided between the light-emitting element D1 and the light emission control transistor (third transistor T3). In order to write a voltage across the capacitor C1 in writing a data signal, the light emission control transistor is desirably provided between the high power supply voltage wiring line and the drive transistor 2a. This is due to the constant potential in the source region of the drive transistor 2a.

As described above, in the display device 1, pixel circuits are provided corresponding to a plurality of pixels, and a plurality of first circuits 3a may be provided side-by-side. Here, in the first circuit 3a, the negative electrode of the light-emitting, element D1 is connected to the low power supply voltage wiring line, and the negative electrode of the light-emitting element D1 is connected to the low power supply voltage wiring line even in first circuits 3a corresponding to other pixels. Thus, the plurality of light-emitting elements D1 may have a configuration in which the negative electrode is shared and is connected to the low power supply voltage wiring line.

Note that the pixel circuits in the display device 1 are not limited to the configuration described above, and, for example, may have a configuration in which the third transistor T3 in the first circuit 3a is not provided. In this case, the drain electrode of the first transistor T1 is connected to the high power supply voltage wiring line, and the light emission control line is not connected to the first circuit 3a.

Second Embodiment

Next, a display device according to a second embodiment of the disclosure will be described with reference to drawings. Note that, in the second embodiment, constituent elements having substantially identical functions to those of the first embodiment will be denoted by the same reference signs, and descriptions thereof will be omitted.

Figure 8:
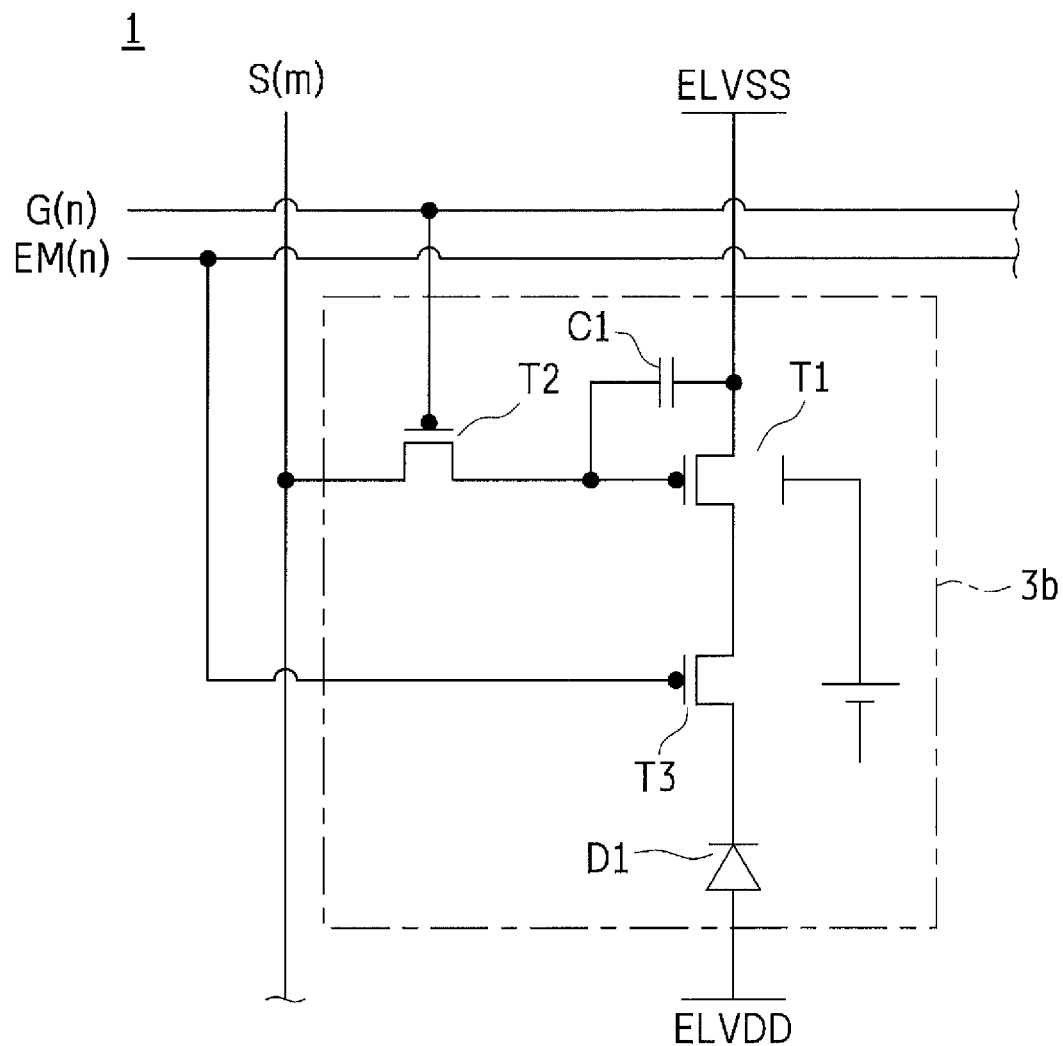
FIG. 8 is an equivalent circuit diagram illustrating a second circuit that is an example of a pixel circuit.

FIG. 8 is an equivalent circuit diagram illustrating a second circuit that is an example of a pixel circuit.

The second embodiment differs from the first embodiment in the configuration of the pixel circuit. FIG. 8 illustrates the vicinity of the second circuit 3b, which is an example of a pixel circuit of the second embodiment.

Similarly to the first circuit 3a, the second circuit 3b includes three transistors (a first transistor T1, a second transistor T2, and a third transistor T3), a capacitor C1, and a light-emitting element D1, but differs in the manner of connecting the electrodes and the like. Specifically, in the first circuit 3a, the light emission control transistor, the drive transistor 2a, and the light-emitting element D1 are connected in that order between the high power supply voltage wiring line and the low power supply voltage wiring line. However, in the second circuit 3b, the light-emitting element D1, the light emission control transistor, and the drive transistor 2a are connected in that order. The detailed connections of the components will be described below.

The drive transistor 2a described above is applied to the first transistor T1. The first transistor T1 includes a source electrode connected to a low power supply voltage wiring line, a drain electrode connected to the source electrode of the third transistor T3, and one gate electrode (lower gate electrode 30) connected to the drain electrode of the second transistor T2. The other gate electrode (upper gate electrode 70) of the first transistor T1 is connected to a fixed voltage source.

The second transistor T2 is a writing transistor, and the switching transistor 2b described above is applied to the second transistor T2. The second transistor T2 includes a source electrode connected to the source signal line, a drain electrode connected to one gate electrode of the first transistor T1, and a gate electrode is connected to the gate signal line.

The third transistor T3 is a light emission control transistor, and the switching transistor 2b described above is applied to the third transistor T3. The third transistor T3 includes a source electrode connected to the drain electrode of the first transistor T1, a drain electrode connected to the negative electrode of the light-emitting element D1, and a gate electrode connected to the light emission control line.

The light-emitting element D1 includes an anode electrode connected to the high power supply voltage wiring line of the first transistor T1 and a cathode electrode connected to the drain electrode of the third transistor T3.

The capacitor C1 includes a first electrode connected to one gate electrode (lower gate electrode 30) of the first transistor T1 and a second electrode connected to the source electrode of the first transistor T1. Note that the second electrode of the capacitor C1 may be connected to the drain electrode side of the first transistor T1. The capacitor C1 is connected similarly to the first circuit 3a, and the second electrode may be connected to the drain electrode side of the first transistor T1.

In the second circuit 3b as well, the light emission control transistor is desirably provided between the high power supply voltage wiring line and the drive transistor 2a. This is due to the second electrode of the capacitor C1 being connected to the low power supply voltage wiring line.

In the second circuit 3b, the anode electrode of the light-emitting element D1 is connected to the high power supply voltage wiring line, and therefore, the plurality of light-emitting elements D1 may have a configuration in which the anode electrode is shared and is connected to the high power supply voltage wiring line in substantially a similar manner to the first circuit 3a.

The display device 1 according to the present embodiment is not particularly limited as long as the device is a display panel including display elements. The display element includes a display element having luminance or a transmittance controlled by current and a display element having luminance or a transmittance controlled by voltage. Examples of the current-controlled display element include organic Electro Luminescent (EL) displays equipped with Organic Light Emitting Diodes (OLED), EL displays such as inorganic EL displays equipped with inorganic light emitting diodes, and Quantum dot Light Emitting Diode (QLED) displays equipped with QLED. Examples of a voltage-controlled display element include a liquid crystal display element and the like.

Note that the presently disclosed embodiments are illustrative in all respects and are not basis for limiting interpretation. Accordingly, the technical scope of the disclosure is not to be construed by the foregoing embodiments only, but is defined based on the description of the claims. All changes within the claims and within the meaning and range of equivalence are included.

The invention claimed is:

1. A display device comprising, on a substrate,
a pixel circuit including a drive transistor and a switching transistor formed by layering an inorganic insulating film, an oxide semiconductor layer, an upper gate insulating layer, an upper gate electrode, and an interlayer insulating film,
wherein the drive transistor and the switching transistor include an oxide semiconductor film formed of the oxide semiconductor layer and provided in an island shape corresponding to the drive transistor and an island shape corresponding to the switching transistor,
the oxide semiconductor film includes a channel region overlapping with the upper gate electrode corresponding to the oxide semiconductor film, and a source region and a drain region provided sandwiching the channel region between the source region and the drain region,
in the drive transistor and the switching transistor, the upper gate electrode, the upper gate insulating layer, and the channel region corresponding to each of the drive transistor and the switching transistor are aligned in a plan view,
the drive transistor is provided with a lower gate electrode and a lower gate insulating layer between the inorganic insulating film and the oxide semiconductor layer,
in the drive transistor, a film thickness of the lower gate insulating layer between an uppermost surface of the lower gate electrode and the oxide semiconductor film is greater than a film thickness of the upper gate insulating layer,
the upper gate electrode includes a plurality of conductive films, and
in a channel length direction in which the source region and the drain region are opposite each other, a length of the lower gate electrode of the drive transistor is less than or equal to a length of each of the plurality of conductive films.

2. The display device according to claim 1,
wherein in the drive transistor, a gate signal is applied to the lower gate electrode and a fixed voltage is applied to the upper gate electrode.

3. The display device according to claim 2,
wherein the fixed voltage is a ground potential.

4. The display device according to claim 1,
wherein in the switching transistor, a gate signal is applied to the upper gate electrode.

5. The display device according to claim 1, further comprising:
a terminal electrode layered on the interlayer insulating film,
wherein the terminal electrode is electrically connected to the source region and the drain region corresponding to the terminal electrode via a contact hole formed in the interlayer insulating film.

6. The display device according to claim 1,
wherein the pixel circuit includes the switching transistor to serve as a writing control transistor.

7. The display device according to claim 6,
wherein in the writing control transistor, a gate signal is applied to the upper gate electrode.

8. The display device according to claim 7,
wherein the writing control transistor is not provided with the lower gate electrode.

9. The display device according to claim 6,
wherein the pixel circuit further includes a capacitor including a first electrode and a second electrode, and
the capacitor includes the first electrode electrically connected to the lower gate electrode of the drive transistor and the second electrode electrically connected to the source region of the drive transistor.

10. The display device according to claim 9, further comprising:
a plurality of light-emitting elements formed on the interlayer insulating film,
wherein each of the plurality of light-emitting elements is formed by layering an anode electrode, a light-emitting layer, and a cathode electrode in this order on the interlayer insulating film, and
the cathode electrode is configured to be shared by the plurality of light-emitting elements.

11. The display device according to claim 10,
wherein the pixel circuit includes the switching transistor to serve as a light emission control transistor, and
the drive transistor is provided between each of the plurality of light-emitting elements and the light emission control transistor.

12. The display device according to claim 9, further comprising:
a plurality of light-emitting elements formed on the interlayer insulating film,
wherein each of the plurality of light-emitting elements is formed by layering an anode electrode, a light-emitting layer, and a cathode electrode in this order on the interlayer insulating film, and
the anode electrode is configured to be shared by the plurality of light-emitting elements.

13. The display device according to claim 12,
wherein the pixel circuit includes the switching transistor to serve as a light emission control transistor, and
the light emission control transistor is provided between the drive transistor and a high power supply voltage wiring line.

14. The display device according to claim 1,
wherein the oxide semiconductor film is formed of a material including an In—Ga—Zn—O based semiconductor.

15. The display device according to claim 14,
wherein the In—Ga—Zn—O based semiconductor includes a crystalline portion.

* * * * *